(12) United States Patent
Fujiki et al.

(10) Patent No.: US 8,912,594 B2
(45) Date of Patent: Dec. 16, 2014

(54) NONVOLATILE SEMICONDUCTOR MEMORY DEVICE INCLUDING SILICON GERMANIUM SEMICONDUCTOR LAYER

(75) Inventors: Jun Fujiki, Kanagawa-ken (JP); Yoshiaki Fukuzumi, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 13/560,260

(22) Filed: Jul. 27, 2012

(65) Prior Publication Data

US 2013/0234231 A1 Sep. 12, 2013

(30) Foreign Application Priority Data

Mar. 7, 2012 (JP) ................. 2012-051028

(51) Int. Cl.
*H01L 29/792* (2006.01)
*H01L 27/115* (2006.01)
*H01L 27/105* (2006.01)

(52) U.S. Cl.
CPC ...... *H01L 29/7926* (2013.01); *H01L 27/11582* (2013.01)
USPC .......................................... 257/326; 257/328

(58) Field of Classification Search
USPC ......................................................... 257/326
See application file for complete search history.

(56) References Cited

U.S. PATENT DOCUMENTS

| | | | |
|---|---|---|---|
| 8,648,409 B2 * | 2/2014 | Joo et al. ........................ | 257/326 |
| 2008/0179659 A1 | 7/2008 | Enda et al. | |
| 2010/0213538 A1 | 8/2010 | Fukuzumi et al. | |
| 2011/0156132 A1 | 6/2011 | Kiyotoshi | |
| 2011/0227140 A1 | 9/2011 | Ishiduki et al. | |
| 2011/0233646 A1 | 9/2011 | Mizushima et al. | |
| 2012/0181602 A1 | 7/2012 | Fukuzumi et al. | |
| 2012/0199898 A1 * | 8/2012 | Alsmeier et al. ............... | 257/326 |
| 2014/0048873 A1 * | 2/2014 | Shim et al. ..................... | 257/331 |

FOREIGN PATENT DOCUMENTS

| | | |
|---|---|---|
| JP | 2008-186868 A | 8/2008 |
| JP | 2010-199312 A | 9/2010 |
| JP | 2011-138945 A | 7/2011 |
| JP | 2011-165972 A | 8/2011 |
| JP | 2011-198806 A | 10/2011 |
| JP | 2011-199177 A | 10/2011 |
| JP | 2012-146861 A | 8/2012 |

* cited by examiner

*Primary Examiner* — Stephen W Smoot
(74) *Attorney, Agent, or Firm* — Oblon, Spivak, McClelland, Maier & Neustadt, L.L.P.

(57) ABSTRACT

According to one embodiment, a nonvolatile semiconductor memory device includes a stacked body, a second insulating layer, a select gate, a memory hole, a memory film, a channel body, a first semiconductor layer, and a second semiconductor layer. The select gate is provided on the second insulating layer. The memory film is provided on an inner wall of the memory hole. The channel body is provided inside the memory film. The first semiconductor layer is provided on an upper surface of the channel body. The second semiconductor layer is provided on the first semiconductor layer. The first semiconductor layer contains silicon germanium. The second semiconductor layer contains silicon germanium doped with a first impurity. A boundary between the first semiconductor layer and the second semiconductor layer is provided above a position of an upper end of the select gate.

15 Claims, 10 Drawing Sheets

NONVOLATILE SEMICONDUCTOR MEMORY DEVICE INCLUDING SILICON GERMANIUM SEMICONDUCTOR LAYER

CROSS-REFERENCE TO RELATED APPLICATIONS

This application is based upon and claims the benefit of priority from the prior Japanese Patent Application No. 2012-051028, filed on Mar. 7, 2012; the entire contents of which are incorporated herein by reference.

FIELD

Embodiments described herein relate generally to a nonvolatile semiconductor memory device and a method for manufacturing the same.

BACKGROUND

In the field of nonvolatile semiconductor memory devices, three-dimensionally stacked memories that can achieve high integration relatively without being constrained by the limitations of resolution in photolithography technology are drawing attention. Some three-dimensionally stacked memories have a configuration in which, for example, memory strings each of which includes a columnar channel body, a tunnel insulating layer, a charge storage layer, and a block insulating layer stacked so as to cover the side surface of the channel body, and a plurality of conductive layers intersecting with the channel body and provided at prescribed intervals in the stacking direction are two-dimensionally arranged in a matrix configuration.

To increase the cell current, a technology is proposed in which a layer made of silicon germanium is provided on the upper surface of the channel body.

Here, in such three-dimensionally stacked memories, a GIDL (gate induced drain leakage) current is used to perform the erasing of data. Therefore, to improve the efficiency of erasing data, it is desired to increase the GIDL current.

DETAILED DESCRIPTION

Figure 1:
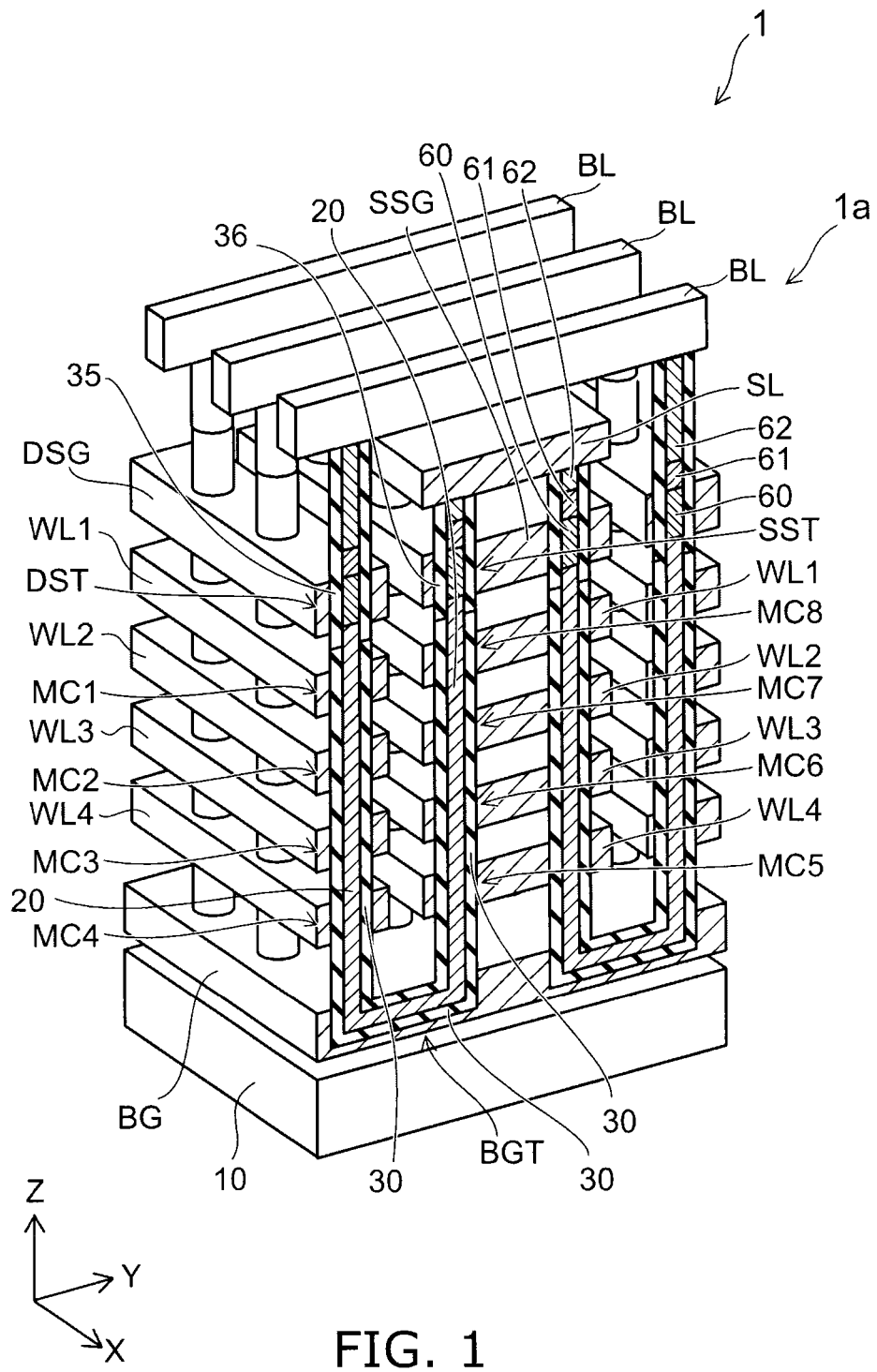
FIG. 1 is a schematic perspective cross-sectional view illustrating a nonvolatile semiconductor memory device according to a first embodiment.

In general, according to one embodiment, a nonvolatile semiconductor memory device includes a stacked body, a second insulating layer, a select gate, a memory hole, a memory film, a channel body, a first semiconductor layer, and a second semiconductor layer. The stacked body includes a plurality of conductive layers and a plurality of first insulating layers alternately stacked. The second insulating layer is provided on the stacked body. The select gate is provided on the second insulating layer. The memory hole penetrates through the stacked body, the second insulating layer, and the select gate in a stacking direction. The memory film is provided on an inner wall of the memory hole. The channel body is provided inside the memory film. The first semiconductor layer is provided on an upper surface of the channel body. The second semiconductor layer is provided on the first semiconductor layer. The first semiconductor layer contains silicon germanium. The second semiconductor layer contains silicon germanium doped with a first impurity. A boundary between the first semiconductor layer and the second semiconductor layer is provided above a position of an upper end of the select gate.

Hereinbelow, embodiments are described with reference to the drawings. In the drawings, similar components are marked with the same reference numerals, and a detailed description is omitted as appropriate.

A nonvolatile semiconductor memory device includes a memory region in which memory cells for storing data are provided, a peripheral circuit region in which a peripheral circuit for driving the memory cells in the memory region is provided, a contact region in which contact electrodes for connecting conductive layers to upper interconnections are provided, the upper interconnections, etc. In this case, known art can be applied to components provided except in the memory region. Hence, herein, the components provided in the memory region are mainly illustrated.

In the following drawings, an XYZ orthogonal coordinate system is used. In the coordinate system, two directions parallel to the major surface of a substrate 10 and orthogonal to each other are defined as the X direction and the Y direction, and the direction orthogonal to both the X direction and the Y direction is defined as the Z direction.

First Embodiment

FIG. 1 is a schematic perspective cross-sectional view illustrating a nonvolatile semiconductor memory device according to a first embodiment.

In FIG. 1, for easier viewing of the drawing, the insulating portions other than an insulating film formed in a memory hole are omitted.

As shown in FIG. 1, a back gate BG is provided above the substrate 10 via a not-shown insulating layer. The back gate BG is formed of, for example, silicon doped with an impurity such as boron to have electrical conductivity. A stacked body including a plurality of conductive layers WL1 to WL4 and a plurality of insulating layers (insulating layers 25 described later) alternately stacked is formed above the back gate BG. The number of conductive layers WL1 to WL4 is arbitrary, and the case of four layers, for example, is illustrated in the embodiment. The conductive layers WL1 to WL4 are formed of, for example, silicon doped with an impurity such as boron to have electrical conductivity.

The conductive layers WL1 to WL4 are divided into a plurality of blocks by trenches extending in the X direction. A drain-side select gate DSG is provided above the uppermost conductive layer WL1 in a block via a not-shown insulating layer. The drain-side select gate DSG is formed of, for example, silicon doped with an impurity such as boron to have electrical conductivity. A source-side select gate SSG is provided above the uppermost conductive layer WL1 in another block adjacent to the block via a not-shown insulating layer. The source-side select gate SSG is formed of, for example, silicon doped with an impurity such as boron to have electrical conductivity.

A source line SL is provided above the source-side select gate SSG via a not-shown insulating layer. A plurality of bit lines BL are provided above the source line SL and the drain-side select gate DSG via a not-shown insulating layer. Each bit line BL extends in the Y direction.

The source line SL and the bit line BL are formed of, for example, silicon doped with an impurity such as boron to have electrical conductivity. Alternatively, the source line SL and the bit line BL may be formed of a metal material.

A plurality of U-shaped memory holes are formed in the stacked body described above provided above the substrate 10. A memory hole that penetrates through the drain-side select gate DSG and the underlying conductive layers WL1 to WL4 and extends in the Z direction (stacking direction) is formed in the block including the drain-side select gate DSG. A memory hole that penetrates through the source-side select gate SSG and the underlying conductive layers WL1 to WL4 and extends in the Z direction is formed in the block including the source-side select gate SSG. Both these memory holes are connected via a memory hole formed in the back gate BG and extending in the Y direction.

A channel body 20 that is a U-shaped semiconductor layer is provided inside a memory film 30 in the memory hole. The channel body 20 may be solid, or may be in a cylindrical shape having a hole in its interior. When the channel body 20 is cylindrical, an insulating film $20a1a$ may be provided in the hole. The channel body 20 is formed of, for example, silicon doped with an impurity such as boron or phosphorus (corresponding to an example of a second impurity) to have electrical conductivity. In this case, the concentration of the impurity in the channel body 20 is lower than the concentration of the impurity in a second semiconductor layer 61.

A first semiconductor layer 60 is provided on the upper surface of the channel body 20, and a second semiconductor layer 61 is provided on the first semiconductor layer 60. A plug 62 having electrical conductivity is provided between the second semiconductor layer 61 and the bit line BL or the source line SL. Details of the first semiconductor layer 60, the second semiconductor layer 61, and the plug 62 are described later.

A gate insulating film 35 is formed on the inner wall of the memory hole between the drain-side select gate DSG and the first semiconductor layer 60. A gate insulating film 36 is formed on the inner wall of the memory hole between the source-side select gate SSG and the first semiconductor layer 60. The memory film 30 is formed on the inner wall of the memory hole between the conductive layers WL1 to WL4 and the channel body 20. The memory film 30 is formed also on the inner wall of the memory hole between the back gate BG and the channel body 20. The gate insulating film 35, the gate insulating film 36, and the memory film 30 have, for example, an ONO (oxide-nitride-oxide) structure in which a silicon nitride film is placed between a pair of silicon oxide films.

Consequently, a drain-side select transistor DST is formed in a portion penetrating through the drain-side select gate DSG. Furthermore, a source-side select transistor SST is formed in a portion penetrating through the source-side select gate SSG. A back gate transistor BGT is formed by the back gate BG, and the channel body 20 and the memory film 30 provided in the back gate BG.

A memory cell MC1 using the conductive layer WL1 as the control gate, a memory cell MC2 using the conductive layer WL2 as the control gate, a memory cell MC3 using the conductive layer WL3 as the control gate, and a memory cell MC4 using the conductive layer WL4 as the control gate are provided between the drain-side select transistor DST and the back gate transistor BGT.

A memory cell MC5 using the conductive layer WL4 as the control gate, a memory cell MC6 using the conductive layer WL3 as the control gate, a memory cell MC7 using the conductive layer WL2 as the control gate, and a memory cell MC8 using the conductive layer WL1 as the control gate are provided between the back gate transistor BGT and the source-side select transistor SST.

The drain-side select transistor DST, the memory cells MC1 to MC4, the back gate transistor BGT, the memory cells MC5 to MC8, and the source-side select transistor SST are connected in series to constitute one memory string. Such a memory string is arranged in plural in the X direction and the Y direction, and thereby a plurality of memory cells MC1 to MC8 are three-dimensionally provided in the X direction, the Y direction, and the Z direction.

Next, the memory string portion is further illustrated.

Figure 2:
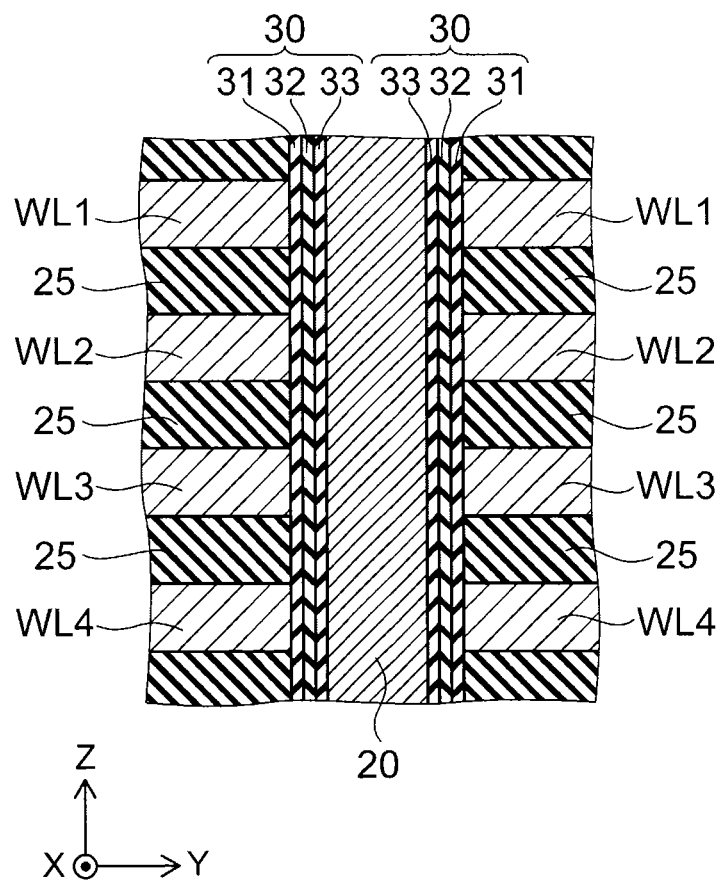
FIG. 2 is a schematic cross-sectional view illustrating the memory string portion.

FIG. 2 is a schematic cross-sectional view illustrating the memory string portion.

Between the conductive layers WL1 to WL4 and the channel body 20, a first insulating film 31, a charge storage layer 32, and a second insulating film 33 are provided in this order from the conductive layers WL1 to WL4 side. The first insulating film 31 is in contact with the conductive layers WL1 to WL4, the second insulating film 33 is in contact with the channel body 20, and the charge storage layer 32 is provided between the first insulating film 31 and the second insulating film 33.

The channel body 20 functions as a channel, the conductive layers WL1 to WL4 function as control gates, and the charge storage layer 32 functions as a data storage layer that stores a charge injected from the channel body 20. That is, a memory cell with a structure in which a control gate surrounds the periphery of a channel is formed at the intersection of the channel body 20 and each of the conductive layers WL1 to WL4.

The nonvolatile semiconductor memory device 1 can perform the erasing and writing of data electrically in a free manner, and can retain the stored content even when the power is turned off. The memory cell is, for example, a memory cell of a charge trap structure. The charge storage layer 32 includes a large number of traps that confine a charge (electron), and is formed of a silicon nitride film, for example. The second insulating film 33 is formed of, for example, a silicon oxide film, and serves as a potential barrier when a charge is injected from the channel body 20 into the charge storage layer 32 or when the charge stored in the charge storage layer 32 diffuses to the channel body 20. The first insulating film 31 is formed of, for example, a silicon oxide film, and prevents the charge stored in the charge storage layer 32 from diffusing to the conductive layers WL1 to WL4.

Figure 3A:
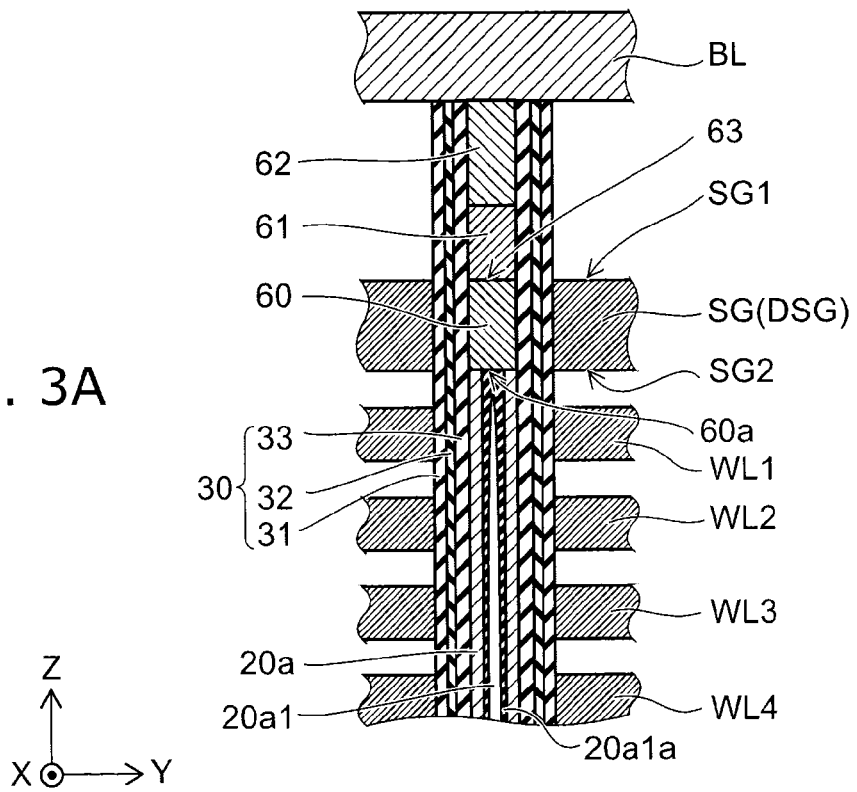
FIGS. 3A and 3B are schematic cross-sectional views illustrating the first semiconductor layer 60, the second semiconductor layer 61, and the plug 62.
Figure 3B:
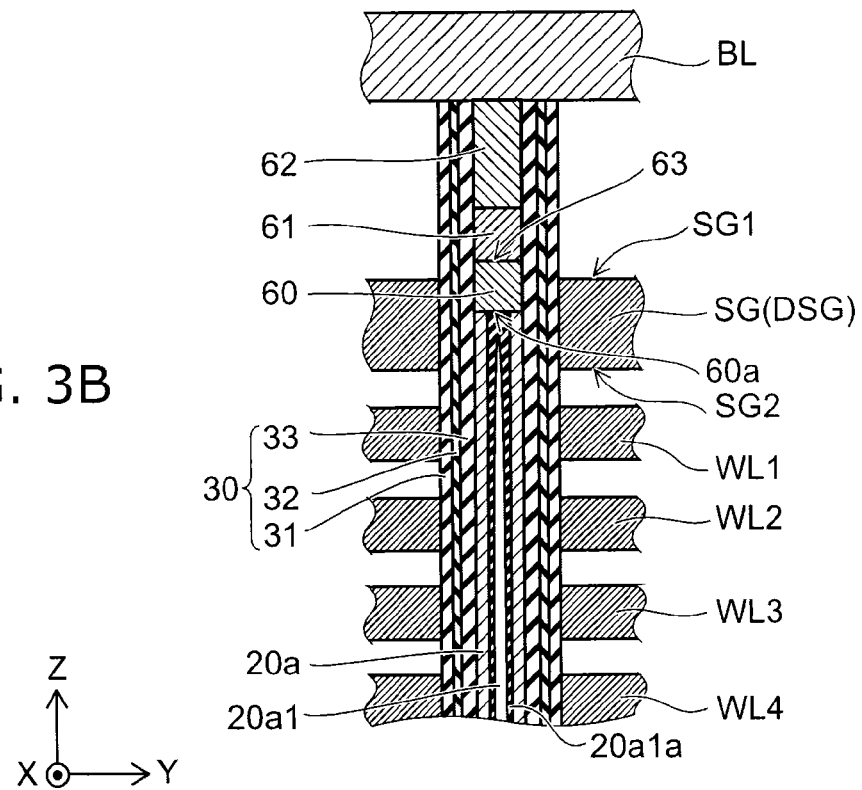

FIGS. 3A and 3B are schematic cross-sectional views illustrating the first semiconductor layer 60, the second semiconductor layer 61, and the plug 62.

In FIGS. 3A and 3B, for easier viewing of the drawing, the insulating portions other than the memory film 30 are omitted.

In the following, the drain-side select gate DSG and the source-side select gate SSG may not be distinguished, and may be referred to as simply a select gate SG.

The first semiconductor layer 60 is provided on the upper surface of a cylindrical channel body $20a$ including a region $20a1$ in its interior. The channel body $20a$ is formed of, for example, silicon doped with an impurity such as boron or phosphorus to have electrical conductivity.

The first semiconductor layer 60 may be formed of, for example, silicon germanium not doped with an impurity.

The first semiconductor layer 60 may also be formed of, for example, silicon germanium doped with an impurity such as phosphorus or arsenic (corresponding to an example of a first impurity).

The second semiconductor layer 61 is provided on the first semiconductor layer 60. The second semiconductor layer 61 may be formed of, for example, silicon germanium doped with an impurity such as phosphorus or arsenic (corresponding to an example of the first impurity).

However, the concentration of the impurity in the second semiconductor layer 61 is higher than the concentration of the impurity in the first semiconductor layer 60.

For example, the concentration of the impurity in the first semiconductor layer 60 may be set less than $10^{20}$ atoms/cm$^3$, and the concentration of the impurity in the second semiconductor layer 61 may be set not less than $10^{21}$ atoms/cm$^3$. In this case, the first semiconductor layer 60 may not be doped with an impurity such as phosphorus or arsenic.

The plug 62 is provided between the second semiconductor layer 61 and the bit line BL. The plug 62 is formed of, for example, silicon doped with an impurity such as boron to have electrical conductivity. The plug 62 is not necessarily needed, and the second semiconductor layer 61 and the bit line BL may be directly connected.

In the case of what are illustrated in FIGS. 3A and 3B, the channel body 20a is connected to the bit line BL via the first semiconductor layer 60, the second semiconductor layer 61, and the plug 62.

Here, in such a three-dimensionally stacked memory as the nonvolatile semiconductor memory device 1, a GIDL current is used to perform the erasing of data. Therefore, if it is possible to increase the GIDL current, the efficiency of erasing data can be improved.

In this case, if the boundary 63 between the first semiconductor layer 60 and the second semiconductor layer 61 is provided above the position of the upper end SG1 of the select gate SG, a situation can be created where the first semiconductor layer 60 having a low impurity concentration or not doped with an impurity is in the position of the upper end SG1 of the select gate SG.

If the first semiconductor layer 60 having a low impurity concentration or not doped with an impurity is located in the upper end SG1 portion of the select gate SG, a high potential difference can be produced in the upper end SG1 portion of the select gate SG. If a high potential difference can be produced in the upper end SG1 portion of the select gate SG, the GIDL current can be increased. Thus, since the amount of generated holes that are injected into the channel body 20a in performing the erasing of data can be increased, the efficiency of erasing data can be improved.

As described above, the boundary 63 between the first semiconductor layer 60 and the second semiconductor layer 61 needs only to be provided above the position of the upper end SG1 of the select gate SG.

In this case, the boundary 63 may be provided in the same position as (flush with) the position of the upper end SG1 of the select gate SG as shown in FIG. 3A, or may be provided in a position above the position of the upper end SG1 of the select gate SG as shown in FIG. 3B.

The lower end 60a of the first semiconductor layer 60 is preferably provided below the upper end SG1 of the select gate SG. Such a configuration can easily increase the GIDL current.

In this case, the lower end 60a of the first semiconductor layer 60 may be in the same position as (flush with) the position of the lower end SG2 of the select gate SG as shown in FIG. 3A, or may be provided in a position above the position of the lower end SG2 of the select gate SG as shown in FIG. 3B. The lower end 60a of the first semiconductor layer 60 may also be provided in a position below the position of the lower end SG2 of the select gate SG.

In this case, the boundary 63 may be provided above the lower end 60a of the first semiconductor layer 60.

When the concentration of the impurity such as phosphorus or arsenic in the first semiconductor layer 60 is set less than $10^{20}$ atoms/cm$^3$ and the concentration of the impurity such as phosphorus or arsenic in the second semiconductor layer 61 is set not less than $10^{21}$ atoms/cm$^3$, the GIDL current can be more easily increased.

Furthermore, the GIDL current can be still more easily increased if the concentration of the impurity such as boron or phosphorus in the channel body 20a is set less than $10^{20}$ atoms/cm$^3$, the concentration of the impurity such as phosphorus or arsenic in the first semiconductor layer 60 is set less than $10^{20}$ atoms/cm$^3$, and the concentration of the impurity such as phosphorus or arsenic in the second semiconductor layer 61 is set not less than $10^{21}$ atoms/cm$^3$.

When the cylindrical channel body 20a including the region 20a1 in its interior or the channel body 20a in which an insulating film 20a1a formed of silicon oxide, silicon nitride or the like is provided in the region 20a1 is used, the cut-off of the select transistor (the drain-side select transistor DST and the source-side select transistor SST) formed in the portion of the select gate SG becomes easy.

Since the first semiconductor layer 60 and the second semiconductor layer 61 containing silicon germanium have a lower electric resistance than the plug 62 containing silicon, the electric resistance can be reduced as compared to the case where the channel body 20a and the bit line BL are connected using only the plug 62.

Since the second semiconductor layer 61 with a high concentration of the impurity such as phosphorus or arsenic has a still lower electric resistance, the electric resistance between the channel body 20a and the bit line BL can be further reduced.

Although the case where the concentration of the impurity changes at the point of the boundary 63 is illustrated in FIGS. 3A and 3B, the configuration is not limited thereto. For example, the concentration of the impurity may gradually change in the neighborhood of the boundary 63. That is, the concentration of the impurity may gradually decrease from the second semiconductor layer 61 side toward the first semiconductor layer 60 side in the neighborhood of the boundary 63. In this case, the ion implantation method or the like may be used to implant an impurity from the second semiconductor layer 61 side, and thereby the concentration of the impurity can be gradually changed.

If the concentration of the impurity is gradually changed, the change in electric resistance can be made gradual.

Here, when the concentration of the impurity changes gradually, the position of the boundary 63 may become unclear.

Hence, in the embodiment, the position of the boundary 63 is defined in the following manner.

Figure 4:
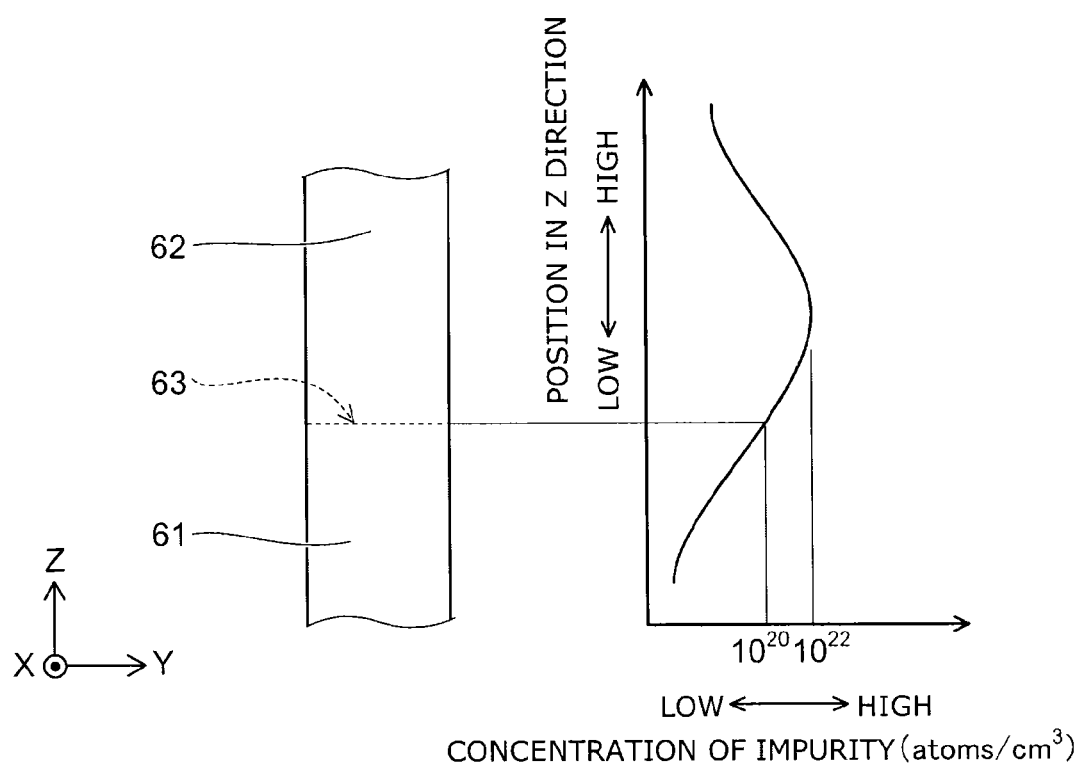
FIG. 4 is a schematic diagram for illustrating the position of the boundary 63.

FIG. 4 is a schematic diagram for illustrating the position of the boundary 63.

As shown in the schematic graph on the right side of FIG. 4, it is assumed that the concentration of the impurity changes gradually.

In this case, the position of the boundary 63 may be defined as a position where a concentration of the impurity of higher than $10^{20}$ atoms/cm$^3$ decreases to become $10^{20}$ atoms/cm$^3$.

For example, in FIG. 4, the position where the concentration of the impurity decreases from $10^{22}$ atoms/cm$^3$ to become $10^{20}$ atoms/cm$^3$ may be taken as the position of the boundary 63.

Second Embodiment

Next, a method for manufacturing a nonvolatile semiconductor memory device according to a second embodiment is illustrated.

As described above, the nonvolatile semiconductor memory device 1 includes the memory region la, the contact region, the peripheral circuit region, the upper interconnections, etc., and know art can be applied to the formation of components provided except in the memory region la. Hence, herein, the formation of the components provided in the memory region la is mainly illustrated.

FIG. 5A to FIG. 9 are schematic process cross-sectional views illustrating a method for manufacturing a nonvolatile semiconductor memory device according to the second embodiment.

The back gate BG is provided above the substrate 10 via a not-shown insulating layer. The back gate BG may be formed of, for example, silicon doped with an impurity such as boron.

Figure 5A:
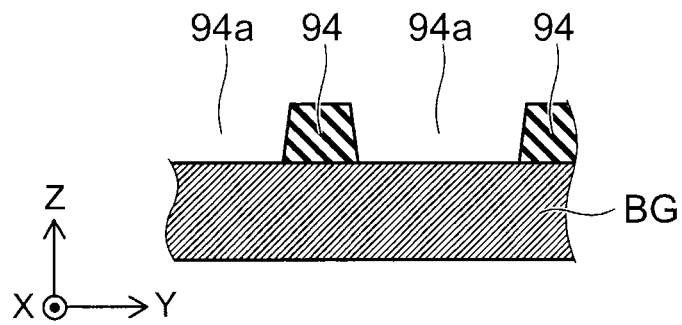
FIG. 5A to FIG. 9 are schematic process cross-sectional views illustrating a method for manufacturing a nonvolatile semiconductor memory device according to the second embodiment.

Then, as shown in FIG. 5A, a resist 94 is formed on the back gate BG. The resist 94 is patterned, and has openings 94a selectively formed.

Figure 5B:
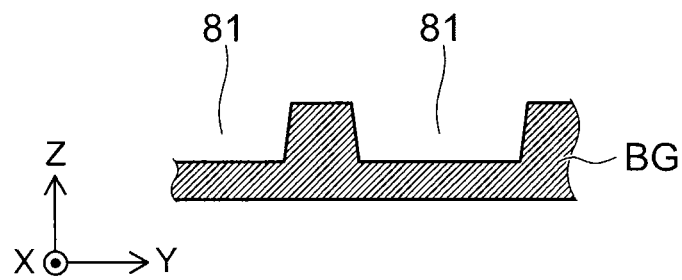

Next, as shown in FIG. 5B, the resist 94 is used as a mask to selectively etch the back gate BG. Thereby, recesses 81 are formed in the back gate BG.

Figure 5C:
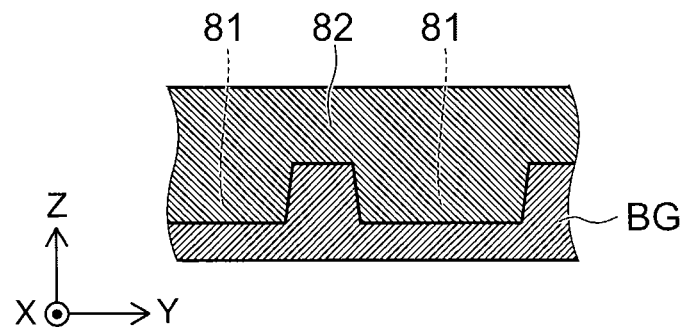

Next, as shown in FIG. 5C, a sacrifice film 82 is buried in the recess 81. The sacrifice film 82 may be formed of, for example, silicon nitride, silicon not doped with an impurity, or the like.

Figure 5D:
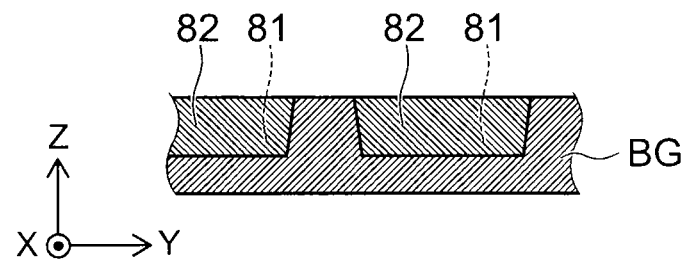

After that, as shown in FIG. 5D, the sacrifice film 82 is overall etched to expose the surface of the back gate BG between a recess 81 and a recess 81.

Figure 6A:
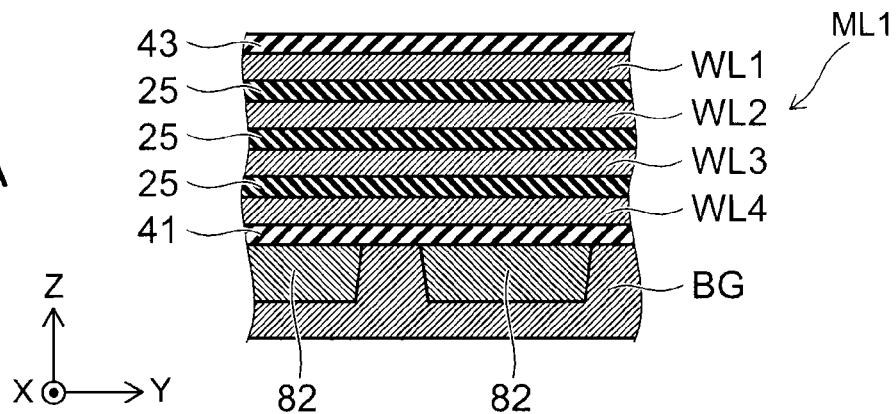

Next, as shown in FIG. 6A, an insulating film 41 is formed on the back gate BG, and then a stacked body ML1 including the plurality of conductive layers WL1 to WL4 and a plurality of insulating layers 25 (corresponding to an example of a first insulating layer) is formed thereon. That is, the stacked body ML1 including the plurality of conductive layers WL1 to WL4 and the plurality of insulating layers 25 alternately stacked is formed above the substrate 10. The conductive layers WL1 to WL4 and the insulating layers 25 are alternately stacked, and the insulating layer 25 is interposed between the conductive layers WL1 to WL4. An insulating film 43 is formed on the uppermost conductive layer WL1.

Figure 6B:
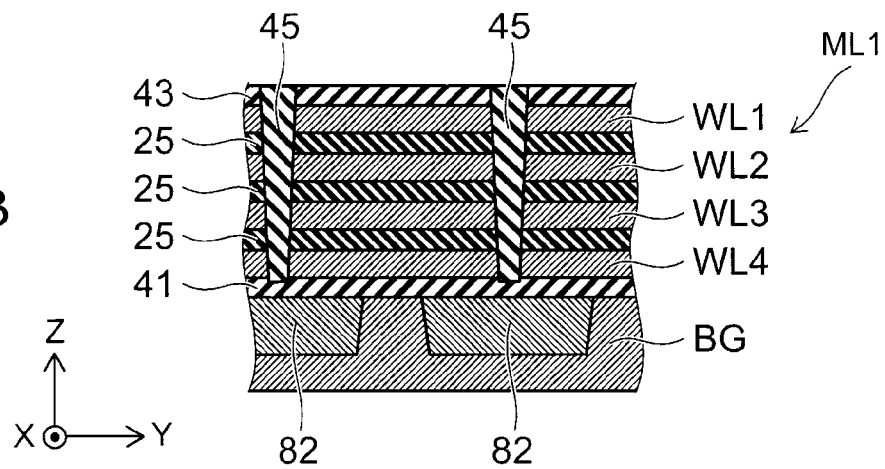

Next, as shown in FIG. 6B, the photolithography method and the RIE (reactive ion etching) method are used to divide the stacked body ML1 to form trenches reaching the insulating film 41, and then the interior of the trench is filled with an insulating film 45. After the interior of the trench is filled with the insulating film 45, overall etching is performed to expose the insulating film 43.

Figure 6C:
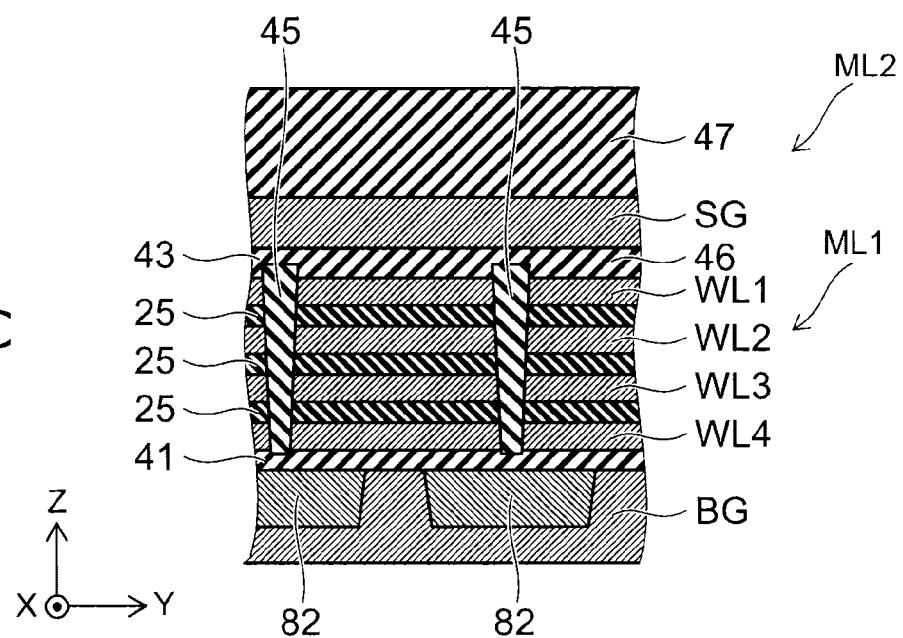

Next, as shown in FIG. 6C, an insulating film 46 (corresponding to an example of a second insulating layer) is formed on the insulating film 43. Further, a stacked body ML2 including a layer that forms the select gate SG and the insulating layer 47 is formed on the insulating film 46. That is, the layer that forms the select gate SG and the insulating layer 47 are formed in this order on the stacked body ML1 to form the stacked body ML2.

Figure 7A:
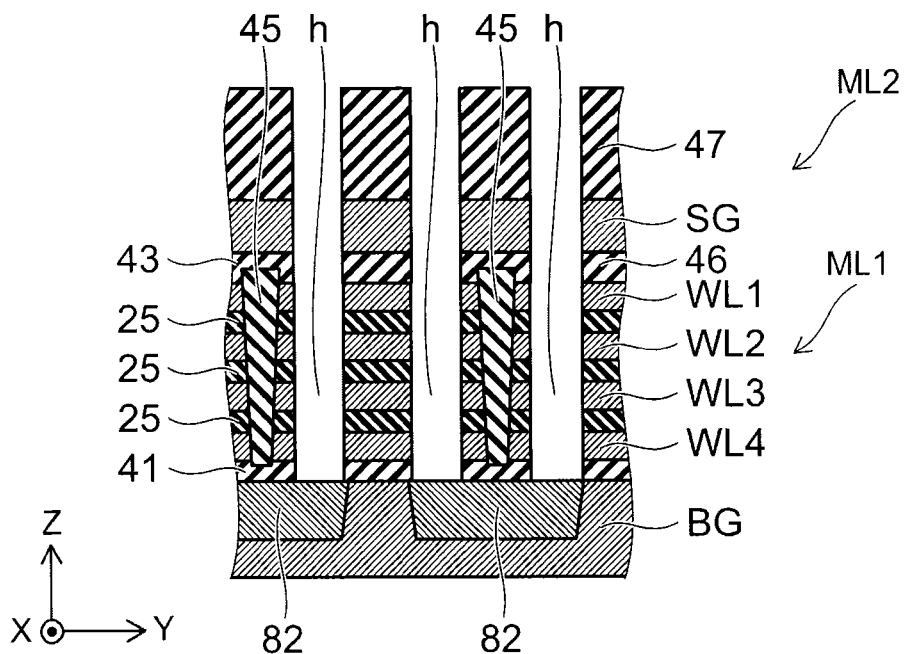

Next, as shown in FIG. 7A, holes h are formed in the stacked body ML1 and the stacked body ML2 above the back gate BG. The holes h are formed by, for example, the RIE method using a not-shown mask. The lower end of the hole h reaches the sacrifice film 82, and the sacrifice film 82 is exposed at the bottom of the hole h. In this case, one pair of holes h are formed on one sacrifice film 82 so as to sandwich the insulating film 45 located almost at the center of the sacrifice film 82.

Next, for example, the wet etching method is used to remove the sacrifice film 82 via the hole h. As the etchant used for the wet etching method, for example, an alkaline chemical liquid such as a KOH (potassium hydroxide) solution, a phosphoric acid solution ($H_3PO_4$) in which the etching rate is adjusted by temperature conditions, or the like may be illustrated.

Figure 7B:
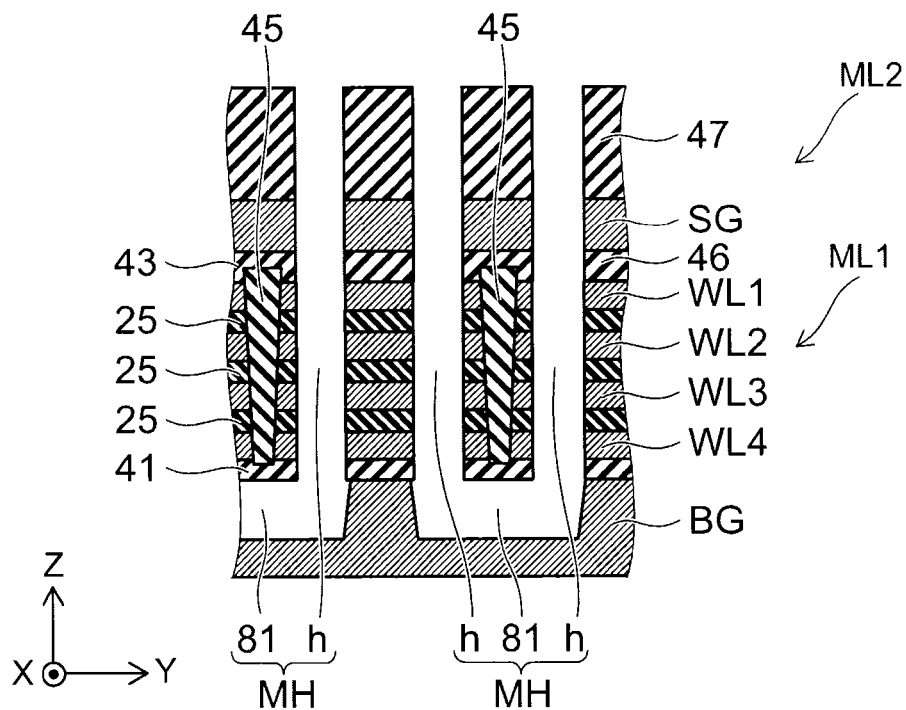

Thereby, as shown in FIG. 7B, the sacrifice films 82 are removed. By the removal of the sacrifice films 82, the recesses 81 are formed in the back gate BG. One pair of holes h are connected to one recess 81. That is, the lower ends of one pair of holes h are connected to one common recess 81 to form one U-shaped memory hole MH.

After that, the memory film 30 shown in FIG. 2 is formed on the inner wall of the memory hole MH in the stacked body ML1 including the plurality of conductive layers WL1 to WL4. Further, silicon doped with an impurity such as boron or phosphorus to have electrical conductivity is buried inside the memory film 30 in the memory hole MH to form the channel body 20. Also a configuration is possible in which a film made of silicon doped with an impurity such as boron or phosphorus to have electrical conductivity is formed inside the memory film 30 and the cylindrical channel body 20a including the region 20a1 in its inside is formed.

In this case, the region 20a1 may be hollow, or may be completely filled with a silicon oxide film, a silicon nitride film, or the like.

An insulating film 20a1a formed of a silicon oxide film, a silicon nitride film, or the like may exist between the hollow region 20a1 and the channel body 20a.

The concentration of the impurity such as boron or phosphorus in the channel bodies 20 and 20a is set less than $10^{20}$ atoms/cm$^3$.

In the following, the case is illustrated where the cylindrical channel body 20a including the hollow region 20a1 is formed.

Figure 8A:
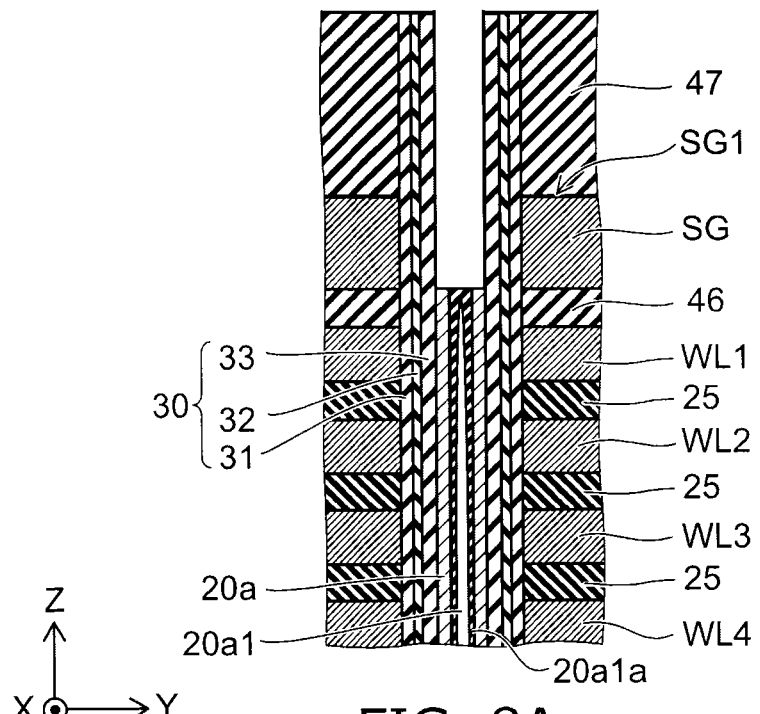

Next, as shown in FIG. 8A, the end portion of the channel body 20a is selectively etched to be recessed using the RIE method etc.

Figure 8B:
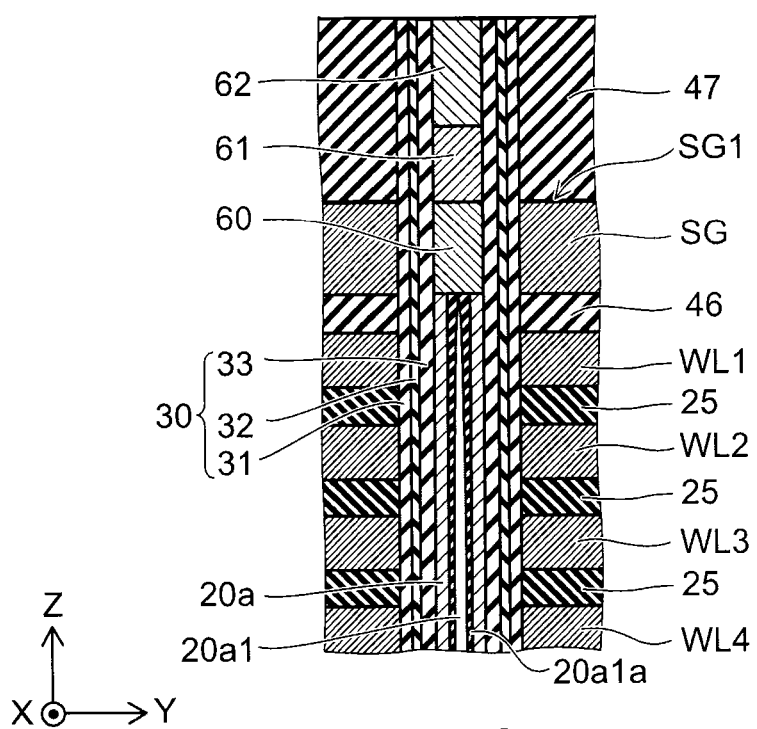
Figure 9:
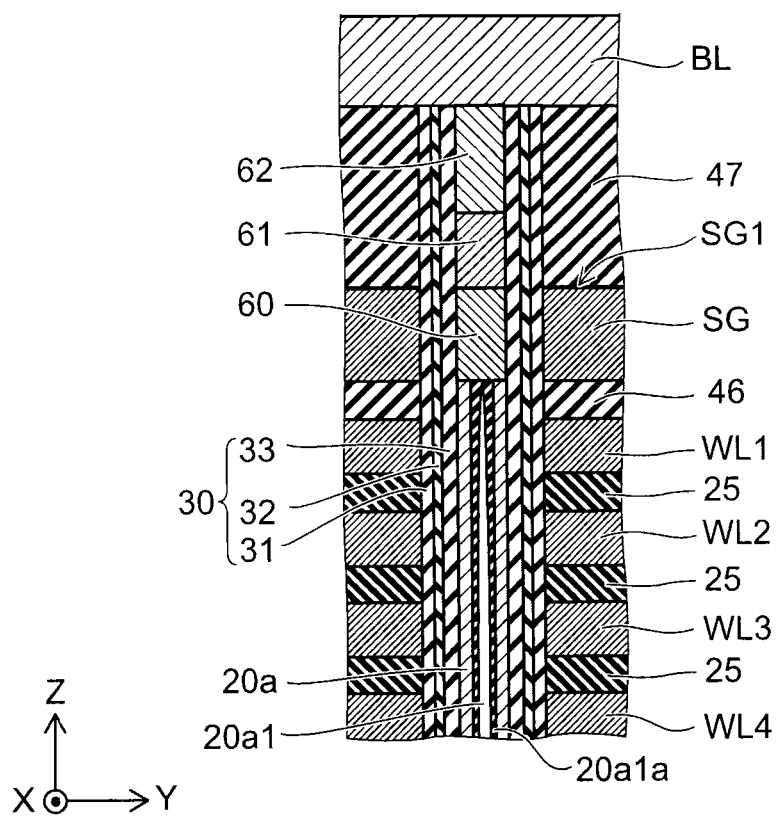

Next, as shown in FIG. 8B, the first semiconductor layer 60 is formed on the upper surface of the channel body 20a. For example, a layer made of amorphous silicon is formed on the upper surface of the channel body 20a, and the ion implantation method or the like is used to introduce germanium to form the first semiconductor layer 60 made of silicon germanium. It is also possible to epitaxially grow the first semiconductor layer 60 made of silicon germanium on the upper surface of the channel body 20a.

At this time, the upper end of the first semiconductor layer 60 is formed above the position of the upper end SG1 of the select gate SG. The upper end of the first semiconductor layer 60 may be formed in the same position as (flush with) the position of the upper end SG1 of the select gate SG, or may be formed in a position above the position of the upper end SG1 of the select gate SG.

When an impurity such as phosphorus or arsenic is introduced into the first semiconductor layer 60 using the ion implantation method etc., the concentration of the impurity in the first semiconductor layer 60 is made less than $10^{20}$ atoms/cm$^3$.

Subsequently, the second semiconductor layer 61 is formed on the first semiconductor layer 60. For example, first, a layer made of amorphous silicon is formed on the first semiconductor layer 60, and the ion implantation method or the like is used to introduce germanium to form the second semiconductor layer 61 made of silicon germanium. It is also possible to epitaxially grow the second semiconductor layer 61 made of silicon germanium on the first semiconductor layer 60. Next, an impurity such as phosphorus or arsenic is introduced into the second semiconductor layer 61 using the ion implantation method etc. In this case, the concentration of the impurity in the second semiconductor layer 61 is made not less than $10^{21}$ atoms/cm$^3$.

In the case where the first semiconductor layer 60 and the second semiconductor layer 61 are individually formed in this way, the interface between the first semiconductor layer 60 and the second semiconductor layer 61 forms the boundary 63.

It is also possible to form the first semiconductor layer 60 and the second semiconductor layer 61 as one body. For example, a layer that forms the first semiconductor layer 60 and the second semiconductor layer 61 is formed as one body using amorphous silicon on the upper surface of the channel body 20a. Then, the ion implantation method or the like is used to introduce germanium into the amorphous silicon to form silicon germanium. It is also possible to epitaxially grow a layer made of silicon germanium on the upper surface of the channel body 20a.

Then, an impurity such as phosphorus or arsenic is introduced using the ion implantation method etc. At this time, the concentration of the impurity of the portion that forms the second semiconductor layer 61 is made not less than $10^{21}$ atoms/cm$^3$. Furthermore, the concentration of the impurity of the portion that forms the first semiconductor layer 60 is made less than $10^{20}$ atoms/cm$^3$. Control is made so that the position of the boundary 63 described above (the position where the concentration of the impurity decreases from $10^{22}$ atoms/cm$^3$ to become $10^{20}$ atoms/cm$^3$) may be located above the position of the upper end SG1 of the select gate SG. The boundary 63 may be formed in the same position as (flush with) the position of the upper end SG1 of the select gate SG, or may be formed in a position above the position of the upper end SG1 of the select gate SG.

Subsequently, the plug 62 is formed on the second semiconductor layer 61. For example, a layer that forms the plug 62 is formed using amorphous silicon on the second semiconductor layer 61. Then, an impurity such as boron is introduced using the ion implantation method etc.

After that, the bit line BL connected to the upper end surface of the plug 62 is formed. For example, a layer made of silicon doped with an impurity such as boron to have electrical conductivity is formed, and the photolithography method and the RIE method are used to form the bit line BL.

Figure 10:
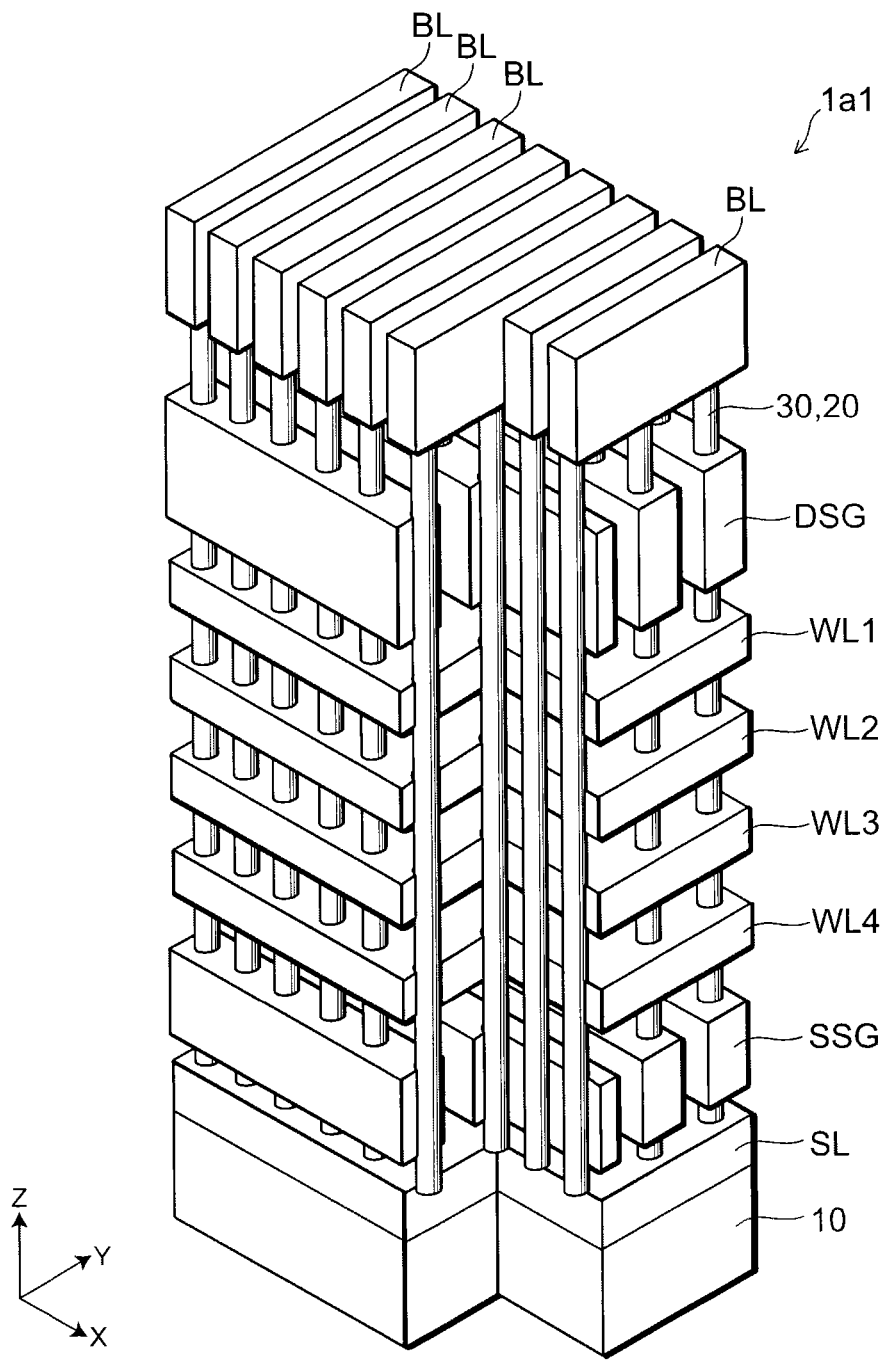
FIG. 10 is a schematic perspective view for illustrating another configuration of a memory region 1a1 provided in the nonvolatile semiconductor memory device 1 according to the first embodiment.

FIG. 10 is a schematic perspective view for illustrating another configuration of a memory region 1a1 provided in the nonvolatile semiconductor memory device 1 according to the first embodiment.

For easier viewing of the drawing, FIG. 10 omits the insulating portions and shows only the conductive portions.

Although a U-shaped memory string is illustrated in FIG. 1, also an I-shaped memory string is possible as shown in FIG. 10.

In this structure, the source line SL is provided on the substrate 10, the source-side select gate (or a lower select gate) SSG is provided thereabove, the conductive layers WL1 to WL4 are provided thereabove, and the drain-side select gate (or an upper select gate) DSG is provided between the uppermost conductive layer WL1 and the bit line BL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A nonvolatile semiconductor memory device comprising:
   a stacked body including a plurality of conductive layers and a plurality of first insulating layers alternately stacked;
   a second insulating layer provided on the stacked body;
   a select gate provided on the second insulating layer;
   a memory film provided on an inner wall of a memory hole penetrating through the stacked body, the second insulating layer, and the select gate in a stacking direction;
   a channel body provided inside the memory film;
   a first semiconductor layer provided on an upper surface of the channel body; and
   a second semiconductor layer provided on the first semiconductor layer,
   the first semiconductor layer containing silicon germanium,
   the second semiconductor layer containing silicon germanium doped with a first impurity,
   a boundary between the first semiconductor layer and the second semiconductor layer being provided above a position of an upper end of the select gate.

2. The device according to claim 1, wherein a concentration of the first impurity in the second semiconductor layer is not less than $10^{21}$ atoms/cm$^3$.

3. The device according to claim 1, wherein
   the first semiconductor layer further contains the first impurity and
   a concentration of the first impurity in the first semiconductor layer is less than $10^{20}$ atoms/cm$^3$.

4. The device according to claim 1, wherein the first semiconductor layer further contains the first impurity and a concentration of the first impurity decreases gradually from the second semiconductor layer toward the first semiconductor layer in a neighborhood of the boundary.

5. The device according to claim 4, wherein a concentration of the first impurity at the boundary is $10^{20}$ atoms/cm$^3$.

6. The device according to claim 1, wherein a position of a lower end of the first semiconductor layer is provided below a position of an upper end of the select gate.

7. The device according to claim 6, wherein a position of a lower end of the first semiconductor layer is provided in a position above a position of a lower end of the select gate.

8. The device according to claim 6, wherein a position of a lower end of the first semiconductor layer is provided in the same position as a position of a lower end of the select gate.

9. The device according to claim 6, wherein a position of a lower end of the first semiconductor layer is provided in a position below a position of a lower end of the select gate.

10. The device according to claim 1, wherein
    the channel body contains silicon doped with a second impurity and
    a concentration of the second impurity is lower than a concentration of the first impurity in the second semiconductor layer.

11. The device according to claim 10, wherein a concentration of the second impurity in the channel body is less than $10^{20}$ atoms/cm$^3$.

12. The device according to claim 1, wherein the channel body includes a hole in its interior.

13. The device according to claim 1, further comprising a plug provided on the second semiconductor layer and having electrical conductivity.

14. The device according to claim 13, wherein
the plug contains silicon and
an electric resistance of the first semiconductor layer and an electric resistance of the second semiconductor layer are lower than an electric resistance of the plug.

15. A nonvolatile semiconductor memory device comprising:
a stacked body including a plurality of conductive layers and a plurality of first insulating layers alternately stacked;
a second insulating layer provided on the stacked body;
a select gate provided on the second insulating layer;
a memory film provided on an inner wall of a memory hole penetrating through the stacked body, the second insulating layer, and the select gate in a stacking direction;
a channel body provided inside the memory film;
a first semiconductor layer provided on an upper surface of the channel body; and
a second semiconductor layer provided on the first semiconductor layer,
the first semiconductor layer containing silicon germanium,
the second semiconductor layer containing silicon germanium doped with a first impurity,
a boundary between the first semiconductor layer and the second semiconductor layer being provided in the same position as a position of an upper end of the select gate.

* * * * *